United States Patent
Bock et al.

(10) Patent No.: US 6,278,417 B1
(45) Date of Patent: Aug. 21, 2001

(54) METHOD OF DRIVING A DISPLAY DEVICE, AND A DISPLAY DEVICE

(75) Inventors: Harald Reinhart Bock, Oxford; Andrew James Hudson, Abingdon; Judy Megan Rorison, Cheltenham, all of (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/162,295

(22) Filed: Sep. 28, 1998

(30) Foreign Application Priority Data

Sep. 30, 1997 (GB) .................................. 9720604

(51) Int. Cl.[7] ...................................................... G09G 5/00
(52) U.S. Cl. ........................... 345/4; 313/509; 315/169.3
(58) Field of Search ............................ 345/4, 5, 76, 204, 345/211; 313/506, 509, 503, 504; 315/169.3

(56) References Cited

U.S. PATENT DOCUMENTS

| 4,155,030 | 5/1979 | Chang | 315/169.3 |
|---|---|---|---|
| 4,691,144 | * 9/1987 | King et al. | 345/76 |
| 4,777,402 | 10/1988 | Mitsumori | 313/509 |
| 4,797,667 | * 1/1989 | Dolinar et al. | 345/76 |
| 5,416,494 | 5/1995 | Yokota et al. | 345/79 |
| 5,600,343 | * 2/1997 | Sarrasin et al. | 345/76 |
| 5,652,600 | * 7/1997 | Khormaei et al. | 345/76 |

FOREIGN PATENT DOCUMENTS

| 2194376 | 3/1988 | (GB) . |
|---|---|---|
| 01006398 | 1/1989 | (JP) . |
| 06302383 | 10/1994 | (JP) . |

* cited by examiner

Primary Examiner—Richard Hjerpe
Assistant Examiner—M Fatahi Yar
(74) Attorney, Agent, or Firm—Renner, Otto, Boisselle & Sklar

(57) ABSTRACT

A display device has two or more display elements. The display device is addressed by applying a set of data signals for one display element and a strobe signal for a second display element simultaneously to a layer of electrodes common to both display elements. Preferentially, the strobe signal for the second element is applied to one electrode, and the data signals for the first element are applied to all other electrodes. The data signals for the one display element are controllable independently from the strobe signal for the second display element.

20 Claims, 5 Drawing Sheets

■ Currently strobe voltage applied

▨ Currently data voltage applied

▦ ▤ ▥ Currently addressed pixels of different colours

| | | | | | | |
|---|---|---|---|---|---|---|
| Data for emitter layer 1 | 0 | 1 | 0 | 1 | | |
| Voltage for emitter layer 1 | ① | 0 | 0 | -1 | | |
| Strobe for layers 1 & 2 | 1 | 1 | 0 | 0 | 1 | 0 |
| Voltage at emitter layer 2 | ① | 0 | 0 | -1 | -1 | -2 |
| Data for 2 / Strobe for 3 | 0 | 1 | 0 | 1 / 2 | 2 | |
| Voltage at emitter layer 3 | -1 | 0 | -2 | -1 | ① | 0 |
| Data for emitter layer 3 | 1 | 1 | 2 | 2 | 1 | 2 |

| | | | | | | |
|---|---|---|---|---|---|---|
| Data for emitter layer 1 | 0 | 2 | 0 | 2 | | |
| Voltage at emitter layer 1 | ③ | 1 | 0 | -2 | | |
| Strobe for layer 1 & 2 | 3 | 3 | 0 | 0 | 3 | 0 |
| Voltage at emitter layer 2 | ③ | 1 | 0 | -2 | -1 | -4 |
| Data for 2/ Strobe for 3 | 0 | 2 | 0 | 2 / 4 | 4 | |
| Voltage at emitter layer 3 | -1 | 1 | -3 | -1 | ③ | 1 |
| Data for emitter layer 3 | 1 | 1 | 3 | 3 | 1 | 3 |

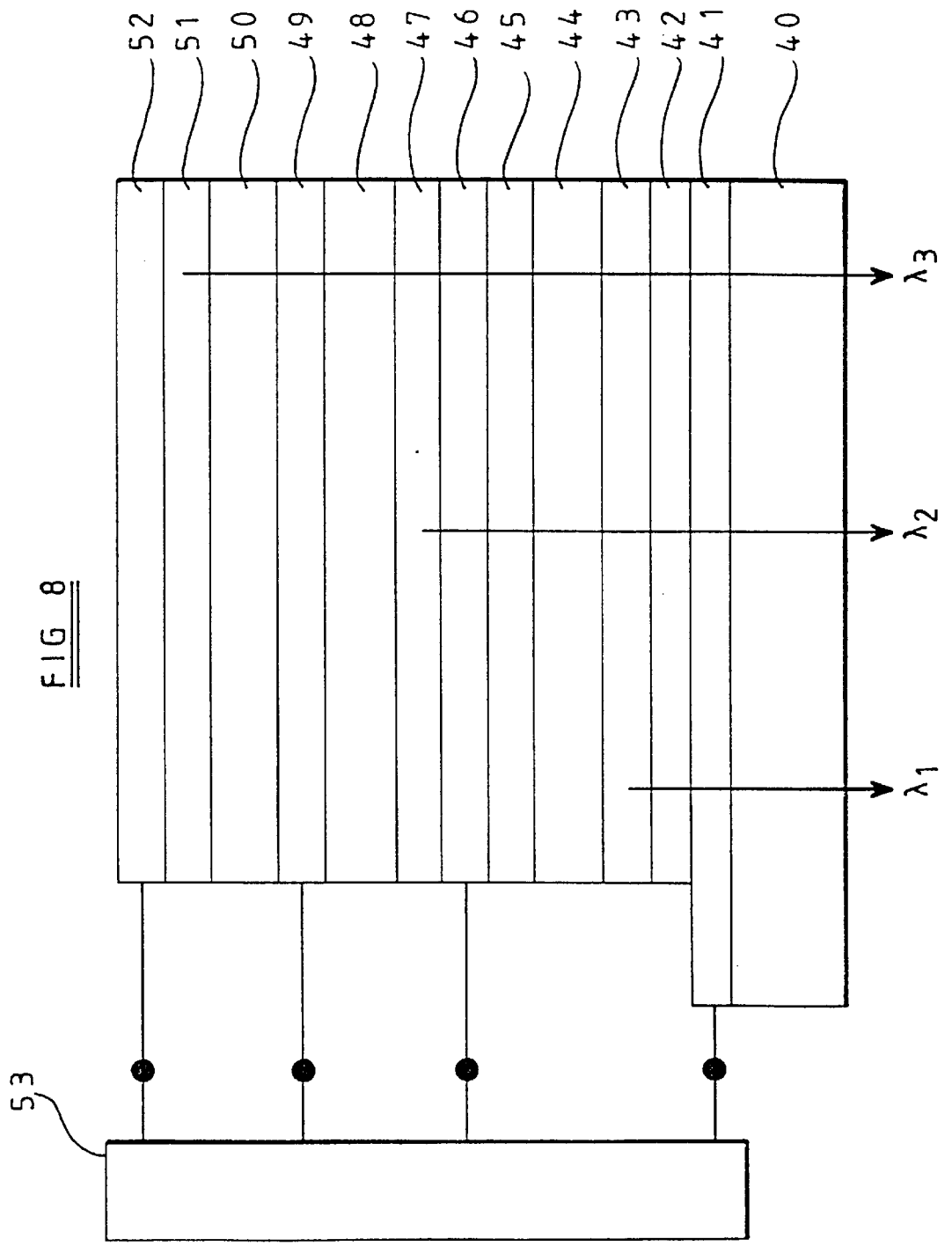

METHOD OF DRIVING A DISPLAY DEVICE, AND A DISPLAY DEVICE

TECHNICAL FIELD OF THE INVENTION

This application relates to a method of driving a display device which has a display element disposed between two electrode layers. The method is a passive addressing method, in which a first voltage, known as a "data voltage", is applied to one of the electrodes and a second voltage, known as a "strobe voltage", a "select voltage" or a "scanning voltage" (hereinafter referred to as a "strobe voltage" for convenience), is applied to the other electrode. The invention also relates to a display device. The invention particularly relates to electro-luminescent display devices.

DESCRIPTION OF THE RELATED ART

An electro-luminescent device ("EL device") generates light as a result of electron-hole recombination. An EL device typically has a multilayer structure, in which an emitter layer is confined between an electron transporting layer (ETL) and a hole transporting layer (HTL). Charge carrier recombination occurs in the emitter layer and photons are generated. It is possible for one layer to act as both the ETL and the emitter layer, in which case recombination of electrons and holes occurs near the interface between the HTL and the ETL/emitter layer.

It is possible to vary the wavelength of light emitted by an EL device by using different materials for the emitter layer, and it is also possible to manufacture an electro-luminescent device that emits white light. Both inorganic materials and organic materials can be used as the emitter layer.

FIGS. 1(a) and 1(b) schematically show the structure of two conventional EL devices, which are described in "Journal of Applied Physics", 65 (9), May 1989, pp 3610–3616. Both devices have an ITO (indium tin oxide) electrode layer 1 disposed on a substrate (not shown). A diamine layer 2 constitutes the HTL in both devices. In the device shown in FIG. 1(a) the emitter layer is formed by a layer 3 of 8-hydroxyquinoline aluminium, Alq, which can be either doped or undoped. Electrons are injected from an Mg:Ag electrode 4. In the device shown in FIG. 1(b) the emitter layer is formed by a doped layer of Alq 5 located within the Alq layer 3. Alternatively, it would be possible to put the doped Alq layer adjacent to the HTL layer 2. As in the device of FIG. 1 (a), electrons are injected from a Mg:Ag electrode 4.

In a known colour EL display, each pixel is laterally divided into three sub-pixels, one for each primary colour. The three colours can be obtained by using three different emitter materials in the three sub-pixels, or by using an EL device which emits white light and providing each sub-pixel with an appropriate colour filter. Alternatively, if an EL device with an emitter material which generates blue light is used, red and green sub-pixels can be obtained by using fluorescent colour filters.

These known colour EL displays are unsatisfactory. Complicated masking techniques are required when applying the emitter materials in order to provide different emitter materials in adjacent sub-pixels. On the other hand, if colour filters are used, they will absorb radiation and so reduce the brightness of the display. They will also heat up as they absorb light and thus heat up the display device.

One way of addressing these problems is to use transparent EL elements, and stack two or more elements capable of emitting light of different wavelengths. A display of this type is disclosed in "Applied Physics Letters" 68 (19) May 6, 1996, pp2606–2608.

FIG. 2 shows the structure of such an electro-luminescent element. The device is grown on a glass substrate 6 coated with an indium tin oxide (ITO) film 7 which acts as a transparent, hole injecting contact. The HTL 8 is a 200 Å (20 nm) thick layer of the hole conducting material N.N'-diphenyl-N.N'-bis(3-methylphenyl) 1-1'biphenyl-4, 4'diamine (TPD), which is deposited by thermal evaporation in a vacuum. The ETUemitter layer 9 is a 400 Å (40 nm) thick layer of the electron conducting and light emitting material tris-(8-hydroxyquinoline) aluminium ($Alq_3$). Typically, EL devices have thick, opaque upper electrodes composed of a low work-function alloy such as Mg:Ag for injection of electrons. For a transparent EL device, this is replaced with a layer 10 of Mg:Ag that is thinner than the optical skin depth, followed by an overlayer of ITO 11. This results in a highly transparent top electrode with injection characteristics similar to that of a conventional upper electrode.

To form this contact, a thin Mg-Ag layer (with a thickness of 50–400 Å (540 nm)) is deposited through a shadow mask by co-evaporation of Mg and Ag in a ratio of 30:1. The sample is then immediately transferred through a load lock to a sputtering chamber. The ITO film is then deposited by low-power sputtering. The target, housed in a magnetron sputtering gun, is 10% $SnO_2$ and 90% $In_2O_3$ by weight with 99% purity. The sputtering gas is a mixture of 99.9999% pure argon and 99.998% pure oxygen.

FIG. 3 shows a further prior art EL display device, which consists of a red EL element 13 stacked on a blue EL element 12. This is described in "Applied Physics Letters" 69 (20) November 1996, pp2606–2608. The device has a 1 mm glass substrate 14, on which a 2000 Å (200 nm) ITO electrode 15 is formed. Layers 16, 17 and 18 are a 600 Å (60 nm) TPD layer, an 800 Å (80 nm) $Alq'_2$ OPh layer and a 360 Å (36 nm) $Alq_3$ layer, and these layers constitute the blue EL element 12.

Layers 19 and 20 are electrode layers: a 130 Å (13 nm) Mg:Al layer and a 550 Å (55 nm) ITO layer. 21 denotes a 600 Å (60 nm) TPD layer, and 22 is a 590 Å (59 nm) TPP/$Alq_3$ layer. Finally, a 1500 Å (150 nm) Mg:Al electrode layer 23 and a 500 Å (50 nm) Ag layer 24 are provided. Layers 20–24 constitute the red EL element.

While EL devices formed of two stacked, transparent EL devices overcome some of the problems outlined above, there are still a number of problems associated with them. Three separate EL elements are required for a full colour display. In a passively addressed device, each EL element would need its own strobe electrode layer and data electrode layer. If the elements were simply stacked one above another, the strobe electrode layer of one element would be adjacent to the data electrode of another EL element. It would thus be necessary to provide additional insulating layers in the device if the three elements were to be driven simultaneously, and this would complicate the structure of the device. It would be possible to drive the three elements sequentially without providing intermediate insulating layers, but this would reduce the brightness of the display. While the brightness can be restored to the required level by using larger driving voltages, it is undesirable to do this because using larger driving voltages will shorten the lifetime of the device.

GB-A-2 194 376 discloses a display device having an electrode layer, a first light-emitting layer, a second electrode layer, a second light-emitting layer, and a third electrode layer disposed in this order. The first light emitting layer is driven by applying a voltage between the first and second electrode layers, and the second light-emitting layer is driven by applying a voltage between the second electrode layer and the third electrode layer. The first and second light-emitting layers are driven sequentially, so that this device suffers from the disadvantages outlined above.

U.S. Pat. No. 4,416,494 discloses an EL device having a first electrode, a first EL layer, a second electrode layer, a second EL layer, and a third electrode layer. In operation, the second electrode layer is earthed, and an A.C. voltage is applied between the first and third electrode layers. This driving method is adopted so that the voltages applied across the two EL layers are 180° out of phase with one another to suppress the generation of piezoelectric noise.

U.S. Pat. No. 4,777,402 discloses a device having two stacked EL layers. An electrode layer is disposed between the two EL layers, and this consists of two separate electrodes. A conductive film is placed below the lower EL layer, and another conductive film is placed above the upper EL layer. In use, a voltage is applied between the two electrodes making up the electrode layer. The conductive films act as equi-potential surfaces, so that an electric field is established between the electrode layer and each of the transparent conductive films. It is not possible to control the electric field applied to one EL element independently from the electric field applied to the other EL element.

The structure of the device of U.S. Pat. No. 4,777,402 is adopted so as to reduce the number of electrode leads required in the device.

Another problem with these known EL displays is that the prior art manufacturing method involves sputtering ITO onto Mg:Ag alloy contacts. The sputtering gas must contain oxygen in order to produce ITO, but this is undesirable since the oxygen will react with the Mg:Ag so leading to the formation of an MgO layer on the contact. This leads to poor film quality and rapid degradation of the device. Moreover, the MgO layer is an electrical insulator and its presence will increase the resistance of the contact and so lead to higher operating voltages and a lower operating efficiency.

SUMMARY OF THE INVENTION

A first aspect of the present invention provides a method of driving a display device having first and second display elements, the method comprising the step of applying a data signal for the first display element and a strobe signal for the second display element to an electrode layer common to the first and second display devices, the data signal for the first display element being controllable independently from the strobe signal for the second display element. This avoids the need to provide two separate electrode layers—one for each display element—with an insulating layer between them.

The data signal for the first display element and the strobe signal for the second display element may be applied to the common electrode layer simultaneously. This means that the brightness of the display can be maintained without the need to increase the signal voltages.

During a scanning period, the data signal for the first display element may be applied to a first part of the common electrode layer and the strobe signal for the second display element may be applied to a second part of the common electrode layer different from said first part.

The first part of the common electrode layer and the second part of the common electrode layer may together constitute the entire common electrode layer. This also serves to maintain the brightness of the display.

The common electrode layer may comprise a set of row or column electrodes and method may comprise applying the strobe signal for the second display element to a selected row or column of the common electrode in the scanning period.

Since the strobe signal for the second display element is applied to the same electrode as the data signal for the first display element, one pixel (in the case of a pixellated display) is not driven in the row or column of the first display element that is being addressed in a scanning period. Over a complete frame, one pixel in each row and column will not be addressed in the first display element. To alleviate this, the method may comprise applying a strobe signal for the first display element to a strobe electrode layer comprising a set of column or row electrodes; and may further comprise the steps of a) applying the strobe signal for the first display element to a selected column or row electrode of the strobe electrode layer in a scanning period in a first frame and simultaneously applying the strobe signal for the second display element to a row or column electrode of the common electrode layer; and b) applying the strobe signal for the first display element to the selected column or row electrode of the strobe electrode layer in a scanning period in a second frame and simultaneously applying the strobe signal for the second display element to another row or column electrode of the common electrode layer. With this driving method the pixels of the first display element that are not addressed in the second frame are not the pixels that were not addressed in the first frame. Since the pattern of pixels that are not addressed in a frame varies from frame to frame, the effect of the non-addressed pixels on a displayed image is reduced.

The data signal for the first display element and the strobe signal for the second display element may be applied to the electrode layer in a time-multiplex manner.

A second aspect of the present invention provides a display device comprising: first and second display elements; an electrode layer disposed between the first display element and the second display element; and a address generator for applying a data signal for the first display element and a strobe signal for the second display element to the electrode layer; the address generator being adapted to control the data signal for the first display element independently from the strobe signal for the second display element. This avoids the need to provide the device with two separate electrode layers, one for each display element, with an insulating layer between them.

The address generator may be adapted to apply the data signal for the first display element and the strobe signal for the second display element simultaneously to the electrode layer. This means that the brightness of the display can be maintained without the need to increase the voltage of the strobe signal or the data signal and this, in turn, means that the life of the display device is not reduced.

The address generator may be adapted to apply, during a scanning period, the data signal for the first display element to a first part of the electrode layer and the strobe signal for the second display element to a second part of the electrode layer different from said first part.

The first part of the electrode layer and the second part of the electrode layer may together constitute the entire electrode. This also serves to maintain the brightness of the display.

The display device may comprise a first electrode layer, a first transparent display element, a second electrode layer, a second transparent display element, and a third electrode layer vertically stacked in this order; and a address generator; and the address generator may be adapted to apply a strobe signal for the first display element to the first electrode layer, to apply the data signal for the first display element and the strobe signal for the second display element to the second electrode layer, and to apply a data signal for the second display element to the third electrode layer.

The first electrode layer may comprise a set of column or row electrodes and the second electrode layer may comprises a set of row or column electrodes; and the address generator may be adapted:

a) to apply the strobe signal for the first display element to a selected column or row electrode of the first electrode layer in a scanning period in a first frame and simultaneously to apply the strobe signal for the second display element to a row or column electrode of the second electrode layer; and b) to apply the strobe signal for the first display element to the selected column or row electrode of the first electrode layer in a scanning period in a second frame and simultaneously to apply the strobe signal for the second display element to another row or column electrode of the second electrode layer.

A third aspect of the present invention provides a display device comprising: a first electrode layer, a first transparent display element, a second electrode layer, a second transparent display element, and a third electrode layer disposed in this order; and an address generator; wherein the address generator is adapted to apply a first data signal for the first display element to the first electrode layer, to apply a second data signal for the second display element to the third electrode, and to apply a strobe signal for both the first display element and the second display element to the second electrode layer.

The display device may further comprise: a third transparent display element disposed on the third electrode layer; and a fourth electrode layer disposed on the third display element; and the address generator may be adapted to apply a data signal for the second display element and a strobe signal for the third display element to the third electrode layer, and to apply a strobe signal for the third electroluminescent element to the fourth electrode layer.

The display devices may be transparent electroluminescent display devices.

BRIEF DESCRIPTION OF THE DRAWINGS

Preferred embodiments of the invention will now be described by way of illustrative example with reference to the accompanying drawings in which:

FIG. 8 shows the structure of the EL device of FIG. 5 in detail.

DETAILED DESCRIPTION OF THE INVENTION

Figures 1A, 1B:
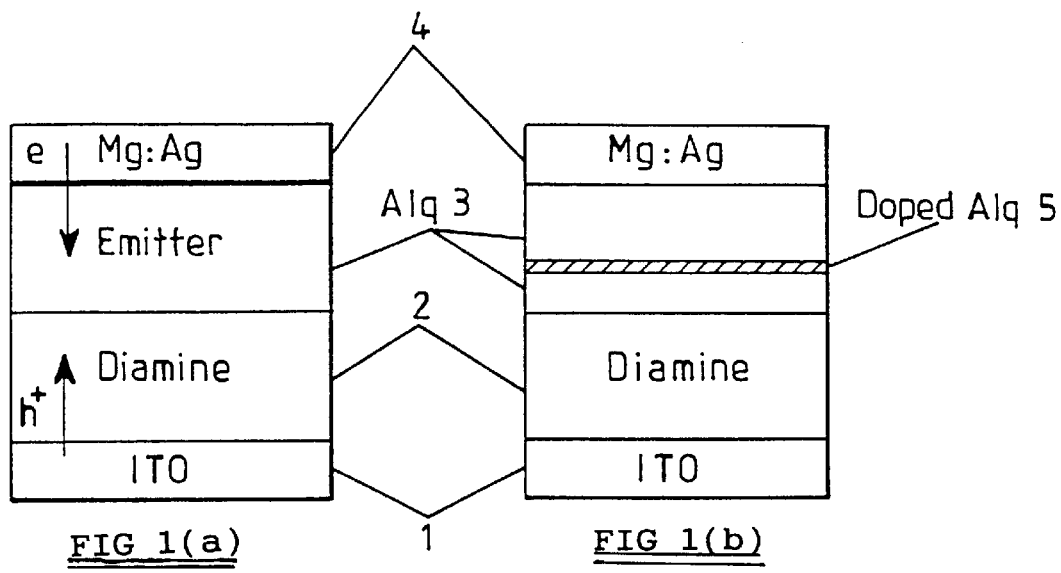
FIGS. 1(a) and 1(b) are schematic sectional views of two conventional EL devices.
Figure 2:
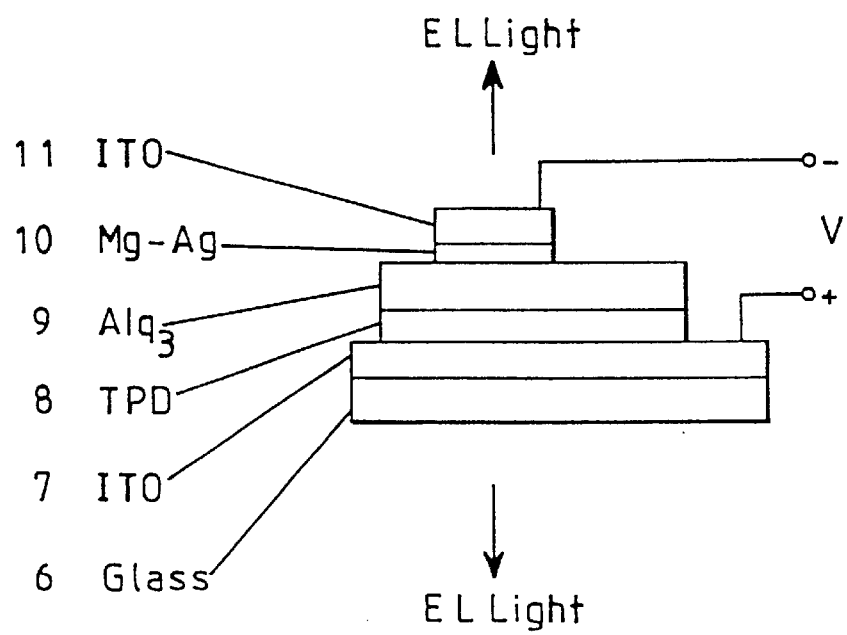
FIG. 2 is a schematic sectional view of a conventional transparent EL device.
Figure 3:
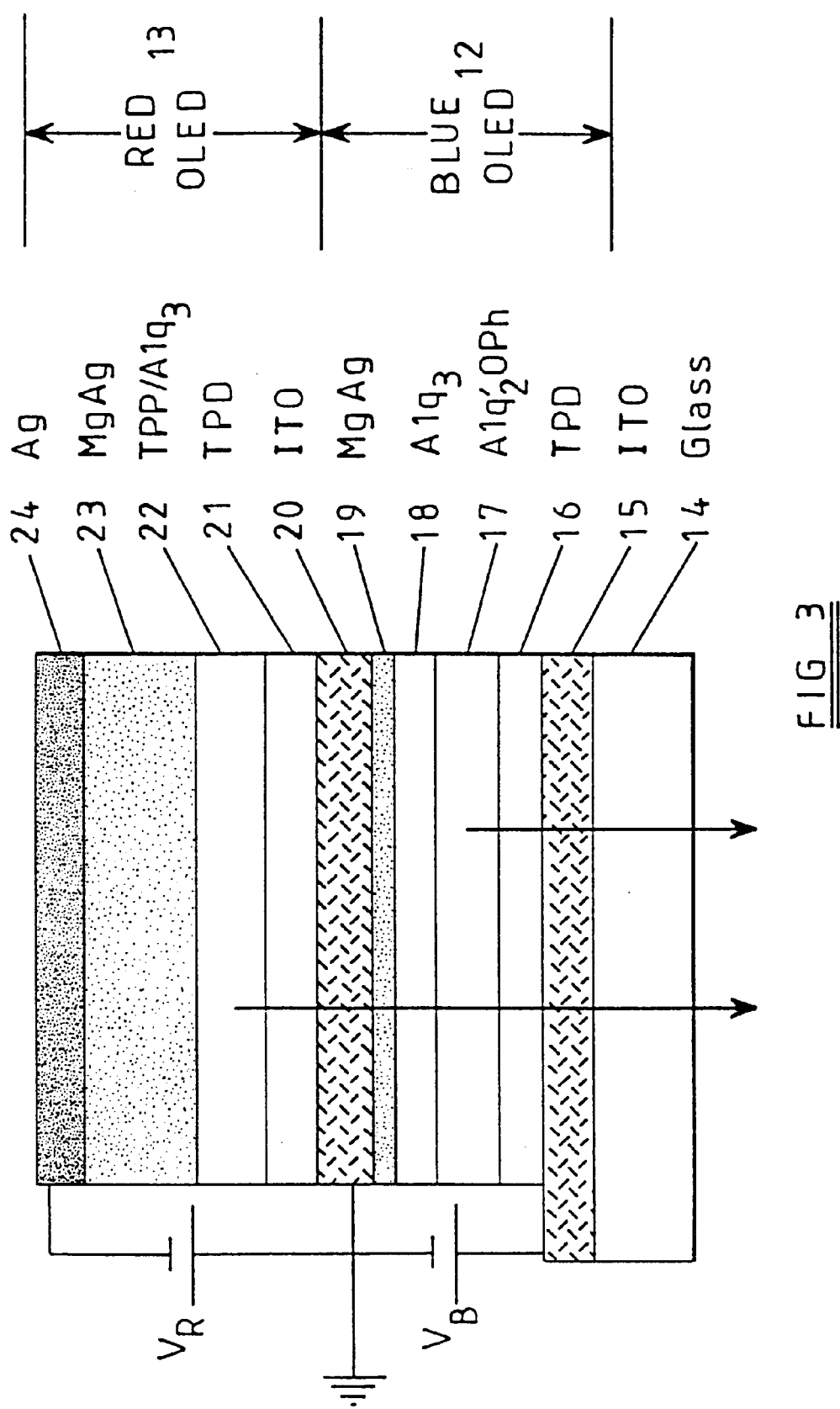
FIG. 3 is a schematic sectional view of another conventional transparent EL device, which comprises a red EL element and a blue EL element.
Figure 4:
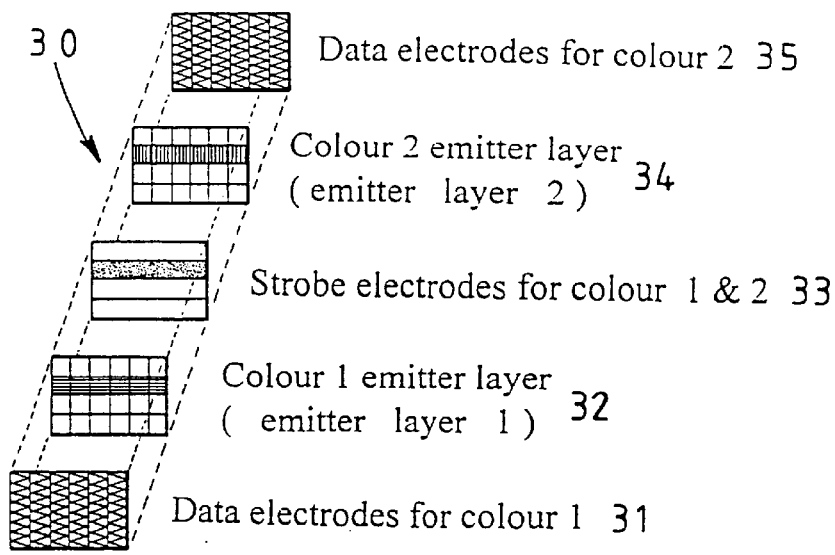
FIG. 4 schematically shows the structure of a stacked two-layer EL device according to a first embodiment of the present invention.

One embodiment of an EL device according to the present invention is shown schematically in FIG. 4. This EL device 30 comprises two vertically stacked, pixellated, transparent EL elements which emit light of different wavelengths. In this embodiment, the two elements emit red and blue light, but other colour combinations are possible. The two elements could emit another combination of two primary colours (i.e., red and green, or green and blue), or one could emit a primary colour and the other could emit the appropriate complementary colour (i.e., red and cyan, green and magenta, or blue and yellow).

The device 30 has a first set of data electrodes 31 for the first (red) EL element, a first emitter layer 32 for emitting red light, a strobe electrode layer comprising a set of strobe electrodes 33, a second emitter layer 34 for emitting blue light and a second set of data electrodes 35 for the second (blue) EL element. The strobe electrodes 33 are common to both EL elements. The data electrodes 31 for the first EL element are parallel to the data electrodes 35 for the second EL element. Both sets of data electrodes are perpendicular to the strobe electrodes 33, and a pixel is defined where a data electrode crosses a strobe electrode. In FIG. 4 the device is shown when a select strobe voltage is applied to the second row of the strobe electrode, so that the pixels in the second row of each EL element are emitting light.

The strobe signal applied to the shared strobe electrode layer can act as the strobe signal for both EL elements at once. Data signals for the first and second EL elements are applied simultaneously to the first and second sets of data electrodes 31, 35. It is possible to address both EL elements simultaneously, but independently of one another, owing to the shared strobe electrode layer 33.

If a full colour EL device is desired, it would need to have three EL elements. It would be possible for two of the three EL elements to share one data electrode layer. This could be done by addressing the two elements alternately, but this would require the address times for these two elements to be half the address time for the third EL element. This would increase the voltage needed and reduce the lifetime of the display. Alternatively, if the address time is not reduced, the brightness of the display would be decreased.

Figure 5:
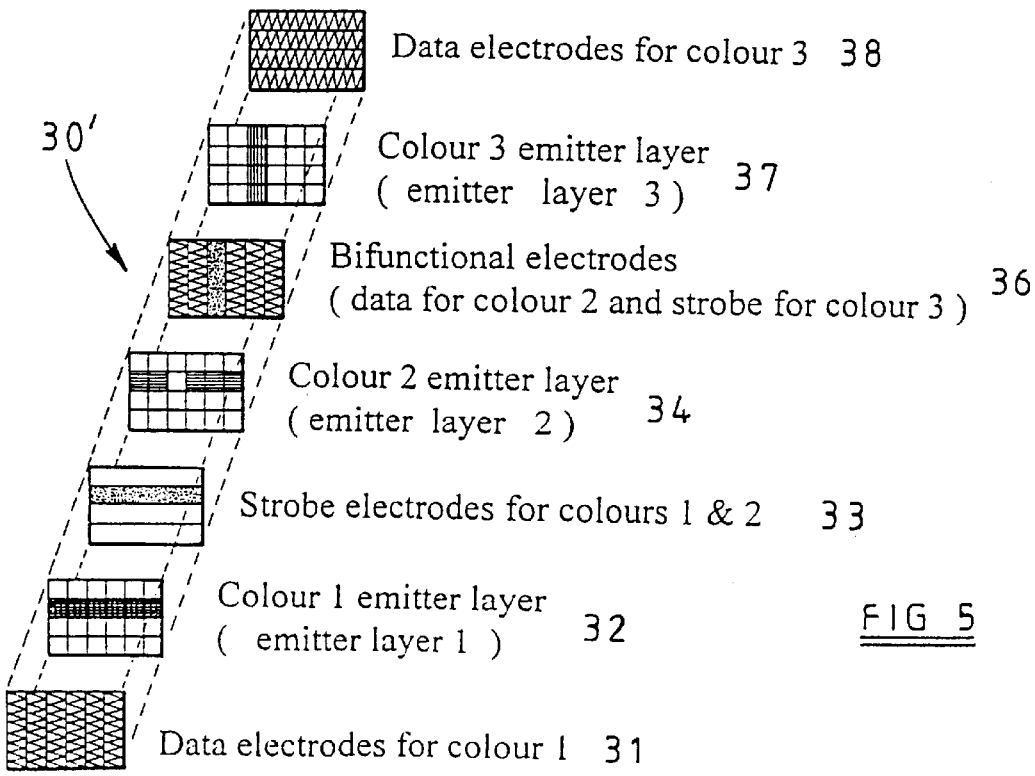
FIG. 5 schematically shows the structure of a stacked three-layer EL device according to a second embodiment of the present invention.

FIG. 5 shows an EL device 30' according to another embodiment of the present invention. This device 30' has three transparent EL elements stacked one above the other and can thus provide a full colour display. In detail, the device has a first set of data electrodes 31 for the first EL element, a first emitter layer 32 for emitting light of a first wavelength, a first set of strobe electrodes 33 common to the first and second EL elements, a second emitter layer 34 for emitting light of a second wavelength, a bi-functional electrode layer comprising bi-functional electrodes 36, a third emitter layer 37 for emitting light of a third wavelength and a second set of data electrodes 38 for the third EL element.

The strobe electrodes 33 are perpendicular to the data electrodes 31, so as to define a matrix of pixels in the emitter layer 32 of the first EL element. The bi-functional electrodes 36 are perpendicular to the strobe electrodes 33, so as to define a matrix of pixels in the emitter layer 34 of the second EL element. The data electrodes 38 are perpendicular to the bi-functional electrodes 36, so as to define a matrix of pixels in the emitter layer 37 for the third EL element.

The bifunctional electrodes 36 between the second and third emitter layers have to supply both the strobe signal to the third emitter layer and the data signal to the second emitter layer. Again, it would be possible to do this sequentially, but this would have the aforementioned drawbacks.

According to an embodiment of this invention, the signal applied to the bi-functional electrodes contains the strobe signal for the third EL element within the data signal for the second EL element. As shown in FIG. 5, in any one scanning period, one of the electrodes (the third from the left in FIG. 5) of the bi-functional electrodes 36 is supplied with the select strobe signal for the third EL element. The remainder of the bi-functional electrodes 36 are supplied with the data signal for the second EL element.

In the row of pixels of the second EL element that is being addressed, one pixel is not correctly addressed. In the addressing state shown in FIG. 5, this is the third pixel from the left in the row that is being addressed.

In the next scanning period, the next bi-functional electrode (the fourth from the left in the example of FIG. 5) is supplied with the select strobe signal for the third EL element, and so on. Thus, in the case of a square display, over an entire frame one pixel of each column of the second EL element and one pixel of each row of the second EL element would not be addressed properly. These "no-colour-two" pixels could be chosen, for example, to form a diagonal of the display. They cannot be chosen entirely freely, because each column and each row of the second EL element must contain such a pixel.

In order to minimise the effect of the "no-colour-two" pixels, it is possible to address the display such that the "no-colour-two" pixels do not form the same pattern in every frame.

The first and third EL elements are not affected by the driving method of this invention. All pixels of the first and third EL elements are driven normally.

In this addressing scheme, the strobe signals for the first and second EL elements select a row of pixels, whereas the strobe signals for the third EL element select a column of pixels. This slightly complicates the addressing scheme when a non-square display is being addressed. For a rectangular display, one solution would be to address the third EL element with a shorter address time than the other two EL elements. In the case of a display with four rows and six columns, as shown in FIG. 5, the address time of the third EL elements would be 67% of the address time for the first and second EL elements. This would have the consequence that, in the signal applied to the bi-functional electrode, the changes in the strobe signal for the third EL element would generally not coincide with changes in the data signal for the second EL element. This would further reduce the effect of the "no-colour-two" pixels on the overall image displayed.

In the case of an elongate display, it would be possible to construct the display as two or more independent displays which are simultaneously addressed. For example, a 4×8 display could be constructed as two separate 4×4 displays.

This method of addressing a display according to the present invention allows one electrode layer to be used to address two EL elements. The number of layers required in the device is reduced, compared to a structure in which each EL element has its own strobe and data electrodes (with intermediate insulating layers), so reducing the cost and simplifying the manufacture of the device. The addressing method of the present invention allows devices having shared electrode layers to be operated at an increased brightness without requiring an increased driving voltage.

It is, of course, possible to extend the addressing scheme of this invention for use with a display having four or more layers.

As is usual with a passive addressing method, the strobe voltages and the data voltages must be chosen such that the voltage applied across a non-selected pixel will not switch the pixel to the ON state. In the present invention there is, therefore, an additional constraint on the strobe and data voltages. If it is desired that the "no-colour-2" pixels are in the OFF state, then the strobe voltages applied to the strobe electrode 33 for colours 1 and 2 and the strobe voltages applied to the bi-functional electrodes must be chosen so that they cannot combine to switch the "no-colour-2" pixel to the ON state.

For addressing a structure having three EL elements—a preferred set of addressing. voltages is as follows:

| | |
|---|---|
| Data voltage for colour one: | mV to (n + m)V |
| Strobe voltage for colours one and two: | (n + m)V |
| Data voltage for colour two: | mV to (n + m)V |
| Strobe voltage for colour three: | (2n + m)V |
| Data voltage for colour three: | (n + m)V to (2n + m)V. |

Figure 6:
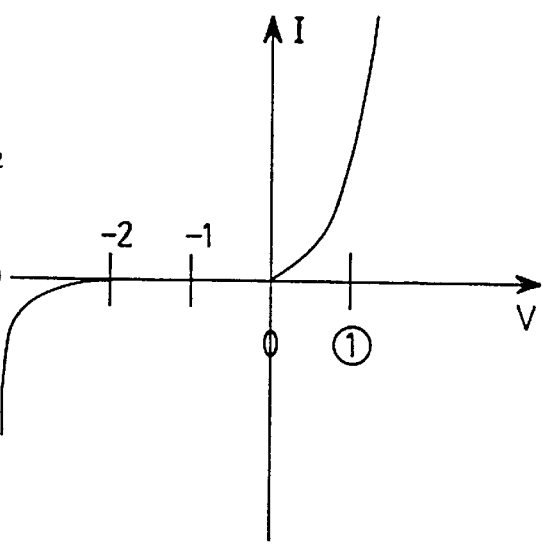
FIG. 6 shows a set of suitable normalised data and strobe voltages, the resulting voltages applied to the emitter layers, and a corresponding current v voltage diagram.

These addressing voltages have the effect that all non-addressed pixels see a voltage of opposite sign to addressed pixels. Addressed pixels see a voltage between 0V and nV (according to the desired brightness), whereas the maximum voltage modulus applied to non-addressed pixels is 2nV. FIG. 6 shows the case with m=0 and n=1 (arbitrary units).

In this embodiment, the strobe voltages for the emitter layers for colours 1 and 2 may be either 1 or 0 (arbitrary units), and the data voltages for these emitter layers are also either 0 or 1. When the strobe voltage applied to a particular pixel in the emitter layer for the first or second colour is 1 and the data voltage is 0, to give a voltage of +1 across the emitter layer, then the pixel is illuminated. Any other combination of data and strobe voltages give a 0 voltage or a negative voltage across a pixel, and this will not cause the pixel to be illuminated.

The strobe voltage for the colour 3 emitter layer is always 2, and the data voltage for the colour 3 emitter layer can be either 1 or 2. When the data voltage is 1, then there is a voltage of +1 across the pixel, and the pixel is illuminated when the data voltage is 2, there is no voltage across the pixel and the pixel is not illuminated.

The data voltages for the colour 2 emitter layer and the colour 3 emitter layer are also chosen so that they cannot combine to switch a pixel in the colour 3 emitter layer to the ON state. The data voltages shown in FIG. 6 for the emitter layers for colour 2 and 3 satisfy this requirement—they combine to produce only negative or zero voltages across the emitter layer for colour 3.

For a structure with three EL elements, an alternative set of preferred addressing voltages is as follows:

| | |
|---|---|
| Data for colour one: | mV to (2n + m)V |
| Strobe for colours one and two: | (3n + m)V |
| Data for colour two: | mV to (2n + m)V |

-continued

| | |
|---|---|
| Strobe for colour three: | $(4n + m)V$ |
| Data for colour three: | $(n + m)V$ to $(3n + m)V$ |

Figure 7:
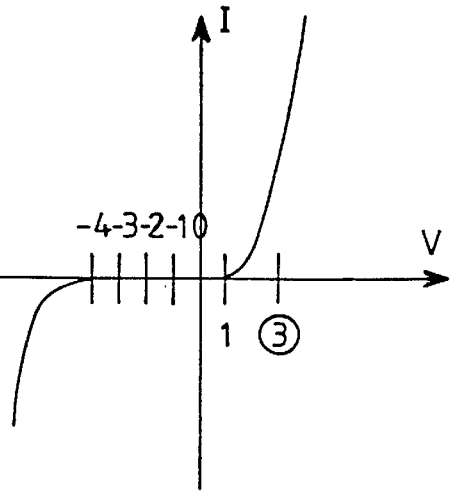
FIG. 7 shows another set of suitable normalised data and strobe voltages, the resulting voltages applied to the emitter layers, and a corresponding current v voltage diagram.

In this addressing scheme a positive voltage is defined to be required for light emission. Non-addressed pixels see a voltage between $-4nV$ and $nV$, whereas addressed pixels see a voltage between $nV$ and $3nV$ (according to the desired brightness). A disadvantage of this scheme is that some non-addressed pixels see positive voltages. However, this addressing scheme has the advantage that the maximum voltage modules applied to any pixel is not significantly higher than the maximum positive voltage. FIG. 7 shows this addressing scheme for the case $m=0$ and $n=1$ (arbitrary units).

The set of addressing voltages used will depend on the current/voltage characteristics of the EL elements. For example, the addressing voltages shown in FIG. 7 would not be suitable for use with EL elements having the current/voltage characteristics shown in FIG. 6. This is because the addressing voltages shown in FIG. 7 produce a positive voltage across some non-addressed pixels, and these pixels would be switched ON in a EL element having the current/voltage characteristics shown in FIG. 6.

Of course, the addressing method of this invention is not limited to use with EL displays but can, in principle, be used to address any device in which two or more elements share a common electrode layer.

FIG. 8 shows the structure of the EL device of FIG. 5 in detail. The device has a glass substrate 40, on which is deposited an ITO electrode 41 and a semi-transparent Mg:Ag layer 42 (the layers 41 and 42 together correspond to the first data electrodes 31 in the device shown in FIG. 5). An ETL 43 which is the emitter layer for colour 1 and corresponds to the layer 32 in FIG. 5, is grown over the Mg:Ag layer 42, and a HTL 44 is grown on the ETL. 43. Layer 45 is another ITO electrode layer, over which is grown a further semi-transparent Mg:Ag 46 (the layers 45 and 46 together correspond to the strobe electrode layer 33 in the device of FIG. 5). Next, and ETL 47, which is the emitter layer for colour 2 and corresponds to the emitter layer 34 in FIG. 5, is grown and a second HTL is grown over the ETL 47. A third ITO electrode 49 is grown over the HTL 48, and this electrode layer corresponds to the bi-functional electrodes 36 of FIG. 5. A third HTL 50 is grown over the third ITO layer 49. A third ETL 51, which forms the emitter layer for colour 3 and corresponds to the emitter layer 37 in the device of FIG. 5, is grown over the third HTL 50. The device is completed by a Mg:Ag layer 52 which is disposed over the third ETL 51. An Ag layer (not shown) can be disposed over the uppermost Mg:Ag layer 52.

A address generator 53 applies appropriate voltages to the electrode layers 31, 33, 36 and 38.

If the layers are grown in this order, the ITO layers are grown on the HTL layers (or on the substrate). These layers are less reactive than Mg:Ag, so that the oxygen present during the sputtering process is less likely to react with the HTL layer and thus be incorporated into the HTL layer during the sputtering process. This inhibits the formation of an oxide layer (which would be electrically insulating) on the electrode.

An alternative method of addressing the problem of oxygen reacting with an Mg:Ag layer in the conventional manufacturing method is to use Al:Li electrodes instead of Mg:Ag electrodes. Al:Li is a very stable alloy, and so is much less reactive with oxygen than is Mg:Ag.

The devices described in this application can be manufactured using conventional growth techniques.

What is claimed is:

1. A method of driving a display device having first and second display elements, the method comprising the steps of:
    applying a data signal for the first display element and a strobe signal for the second display element to an electrode layer common to the first and second display elements,
    wherein the data signal for the first display element and the strobe signal for the second display element are applied so that the first and second display elements are controllable independently from each other.

2. A method of driving a display device as claimed in claim 1, wherein the data signal for the first display element is applied to the common electrode layer simultaneously to the strobe signal for the second display element being applied to the common electrode layer.

3. A method of driving a display device as claimed in claim 2 wherein, for a scanning period, the data signal for the first display element is applied to a first part of the common electrode layer and the strobe signal for the second display element is applied to a second part of the common electrode layer different from said first part.

4. A method of driving a display device as claimed in claim 3 wherein the first part of the common electrode layer and the second part of the common electrode layer together constitute the entire common electrode layer.

5. A method of driving a display device as claimed in claim 3 wherein the common electrode layer comprises a set of row or column electrodes and the strobe signal for the second display element is applied to a selected row or column electrode of the common electrode layer in the scanning period.

6. A method of driving a display device as claimed in claim 5, further comprising applying a strobe signal for the first display element to a strobe electrode layer, the strobe electrode layer comprising a set of column or row electrodes; wherein the step of applying the strobe signal for the first display element to the strobe electrode layer includes the steps of:
    a) applying the strobe signal for the first display element to a selected column or row electrode of the strobe electrode layer in a scanning period in a first frame and simultaneously applying the strobe signal for the second display element to a row or column electrode of the common electrode layer; and
    b) applying the strobe signal for the first display element to the selected column or row electrode of the strobe electrode layer in a scanning period in a second frame and simultaneously applying the strobe signal for the second display element to another row or column electrode of the common electrode layer.

7. A method of driving a display device as claimed in claim 1, wherein the data signal for the first display element and the strobe signal for the second display element are applied to the common electrode layer in a time-multiplex manner.

8. A display device comprising:
    first and second display elements;
    an electrode layer disposed between the first display element and the second display element; and
    an address generator for applying a data signal for the first display element and a strobe signal for the second display element to the electrode layer, the address generator being adapted to control the first display element independently from the second display element.

9. A display device as claimed in claim 8, wherein the address generator is adapted to apply the data signal for the first display element and the strobe signal for the second display element simultaneously to the electrode layer .

10. A display device as claimed in claim 9, wherein the address generator is adapted to apply, during a scanning period, the data signal for the first display element to a first part of the electrode layer and the strobe signal for the second display element to a second part of the electrode layer different from said first part.

11. A display device as claimed in claim 10, wherein the address generator is adapted to apply the data signal for the first display element and the strobe signal for the second display element such that the first part of the electrode layer and the second part of the electrode layer together constitute the entire electrode layer.

12. A display device comprising a first electrode layer, a first transparent display element, a second electrode layer, a second transparent display element, and a third electrode layer vertically stacked in this order; and an address generator, wherein the address generator is adapted to apply a strobe signal for the first display element to the first electrode layer, to apply a data signal for the first display element and a strobe signal for the second display element to the second electrode layer, and to apply a data signal for the second display element to the third electrode layer, and the first display element is controlled independently from the second display element.

13. A display device as claimed in claim 12 wherein the first electrode layer comprises a set of column or row electrodes and the second electrode layer comprises a set of row or column electrodes; and wherein the address generator is adapted:

a) to apply the strobe signal for the first display element to a selected column or row electrode of the first electrode layer in a scanning period in a first frame and simultaneously to apply the strobe signal for the second display element to a row or column electrode of the second electrode layer; and b) to apply the strobe signal for the first display element to the selected column or row electrode of the first electrode layer in a scanning period in a second frame and simultaneously to apply the strobe signal for the second display element to another row or column electrode of the second electrode layer.

14. A display device comprising a first electrode layer, a first transparent display element, a second electrode layer, a second transparent display element, and a third electrode layer disposed in this order; and an address generator and, wherein the address generator is adapted to apply a first data signal for the first display element to the first electrode layer, to apply a second data signal for the second display element to the third electrode layer, and to apply a strobe signal for both the first display element and the second display element to the second electrode layer, and the first display element is controlled independently from the second display element.

15. A display device as claimed in claim 14 and further comprising: a third transparent display element disposed on the third electrode layer; and a fourth electrode layer disposed on the third display element; and wherein the address generator is adapted to apply a data signal for the second display element and a strobe signal for the third display element to the third electrode layer, and to apply a data signal for the third display element to the fourth electrode layer.

16. A display device as claimed in claim 8, wherein the display device is transparent electro-luminescent display devices.

17. A display device as claimed in claim 12, wherein the display device is transparent electro-luminescent display devices.

18. A display device as claimed in claim 14, wherein the display device is transparent electro-luminescent display devices.

19. A method of driving a display device having first and second display elements, the method comprising the step of applying a data signal for the first display element and a strobe signal for the second display element to an electrode layer common to the first and second display elements, the data signal for the first display element being controllable independently from the strobe signal for the second display element, wherein the data signal for the first display element and the strobe signal for the second display element are applied to the common electrode layer simultaneously, wherein, for a scanning period, the data signal for the first display element is applied to a first part of the common electrode layer and the strobe signal for the second display element is applied to a second part of the common electrode layer different from said first part, wherein the common electrode layer comprises a set of row or column electrodes and the strobe signal for the second display element is applied to a selected row or column electrode of the common electrode layer in the scanning period, further comprising applying a strobe signal for the first display element to a strobe electrode layer, the strobe electrode layer comprising a set of column or row electrodes, wherein the step of applying the strobe signal for the first display element to the strobe electrode layer includes the steps of:

a) applying the strobe signal for the first display element to a selected column or row electrode of the strobe electrode layer in a scanning period in a first frame and simultaneously applying the strobe signal for the second display element to a row or column electrode of the common electrode layer; and b) applying the strobe signal for the first display element to the selected column or row electrode of the strobe electrode layer in a scanning period in a second frame and simultaneously applying the strobe signal for the second display element to another row or column electrode of the common electrode layer.

20. A display device comp a first electrode layer, a first transparent display element, a second electrode second transparent display element, and a third electrode layer vertically stacked in this order; and an address generator; wherein the address generator is adapted to apply a strobe signal for the first display element and a strobe signal for the second display element to the second electrode layer, and to apply a data signal for the second display element to the third electrode layer, wherein the first electrode layer comprises a set of column or row electrodes and the second electrode layer comprises a set of row or column electrodes; and wherein the address generator is adapted to:

a) apply the strobe signal for the first display element to a selected column or row electrode of the first electrode layer in a scanning period in a first frame and simultaneously apply the strobe signal for the second display element to a row or column electrode of the second electrode layer; and b) apply the strobe signal for the first display element to the selected column or row electrode of the first electrode layer in a scanning period in a second frame and simultaneously apply the strobe signal for the second display element to another row or column electrode of the second electrode layer.

\* \* \* \* \*